INVENTOR
SANG Y. WHANG
BY Eugene S. Lovette
ATTORNEY

INVENTOR
SANG Y. WHANG
BY Eugene S. Lovette
ATTORNEY

INVENTOR
SANG Y. WHANG
BY Eugene S. Lovelle
ATTORNEY

"ALL-PASS NETWORK"

INVENTOR
SANG Y. WHANG
BY Eugene S. Lovette
ATTORNEY

INVENTOR
SANG Y. WHANG
BY Eugene S. Lovelle
ATTORNEY

INVENTOR
SANG Y. WHANG
BY Eugene S. Lovette
ATTORNEY

Feb. 25, 1964 SANG Y. WHANG 3,122,716

ELECTRICAL FILTER CONSISTING OF FREQUENCY DISCRIMINATING SECTION CONCATENATED WITH ALL-PASS COMPLEMENTARY PHASE CORRECTING SECTION

Filed Aug. 24, 1961 10 Sheets-Sheet 7

INVENTOR
SANG Y. WHANG
BY Eugene S. Lovette
ATTORNEY

Feb. 25, 1964 SANG Y. WHANG 3,122,716

ELECTRICAL FILTER CONSISTING OF FREQUENCY DISCRIMINATING SECTION CONCATENATED WITH ALL-PASS COMPLEMENTARY PHASE CORRECTING SECTION

Filed Aug. 24, 1961 10 Sheets-Sheet 8

INVENTOR
SANG Y. WHANG
BY Eugene S. Lovelle
ATTORNEY

INVENTOR
SANG Y. WHANG
BY Eugene S. Lovette
ATTORNEY

INVENTOR
SANG Y. WHANG
BY Eugene S. Rovelle
ATTORNEY

United States Patent Office 3,122,716

Patented Feb. 25, 1964

3,122,716

ELECTRICAL FILTER CONSISTING OF FREQUENCY DISCRIMINATING SECTION CONCATENATED WITH ALL-PASS COMPLEMENTARY PHASE CORRECTING SECTION

Sang Y. Whang, Brooklyn, N.Y., assignor to Seg Electronics Co., Inc., Brooklyn, N.Y., a corporation of New York Filed Aug. 24, 1961, Ser. No. 134,037
1 Claim. (Cl. 333—28)

This invention relates to an electric filter designed to pass electric signals of a selected frequency range and to reject electric signals of all other frequency ranges. In particular, this instant invention relates to an electric filter with minimum phase distortion.

A filter to pass a certain frequency range and to reject any other frequency range is not new at all. There are many types of filters in the field. Selection of the filter is made according to individual need of the frequency range selected to pass and the others selected to reject and also how well to pass and how well to reject. Most of these filters can be designed from tables made for standard design of filters by knowing required amplitude characteristics or sometimes called attenuation characteristics.

A tabulation for the design of filters is described in chapter 7 of "Reference Data for Radio Engineers" (Fourth Edition), published by International Telephone and Telegraph Corporation. An engineer skilled in the art may design a standard filter by simply looking up a suitable table or reference book, such as the reference hereinbefore mentioned. Filters designed in this manner can provide excellent attenuation characteristics to pass and reject appropriate frequency ranges.

Until very recently, the requirement for the filter was mainly for attenuation characteristics and little or no requirement was placed upon the phase characteristics. A filter designed with only attenuation characteristics in mind naturally has phase characteristics which are quite far from ideal.

As data transmission through telephone lines became common, the prior art type of filter has become a source of trouble because the filter causes phase distortion, sometimes called delay distortion. Some effort has been made to design a filter with linear phase characteristics. The cited reference includes some filters with linear phase. However, the linear phase filters illustrated in the reference are limited to the low pass filter only and, furthermore, this linear phase is obtained at the sacrifice of attenuation characteristics.

Common types of filters required for a system which uses the telephone line as a part of the system is a band pass filter designed to cut off low frequency and high frequency and pass a band of frequencies between the high and low. A typical system of this nature employs electric signals with a frequency spectrum ranging from 270 to 2000 cycles per second. A band pass filter is needed to reject low frequency power line interference and high frequency noise. Sometimes a part of the signal frequency spectrum is cut off just to block low and high frequency interference. This loss of some of the frequency spectrum of the signal causes some distortion in the output of the system. However, even if all of the frequency spectrum is passed through the filter, the output wave is still distorted because of the phase distortion.

A typical phase characteristic of a band pass filter is shown in FIG. 1. As one can see, the phase characteristic is not linear. From 700 cycles up, the phase characteristic seems to be fairly linear, however, the extension of this linear portion intersects with the ordinate at about 100 degrees.

It is the principal object of this instant invention to provide a band-pass filter which has minimum phase distortion and a method of designing same.

It is a further object of this instant invention to provide a design technique for an all-pass phase correction network, which will be applied to any filter or amplifier or any other linear system.

Further objects and advantages will become apparent from the following description taken in conjunction with the figures, in which.

Figure 2:
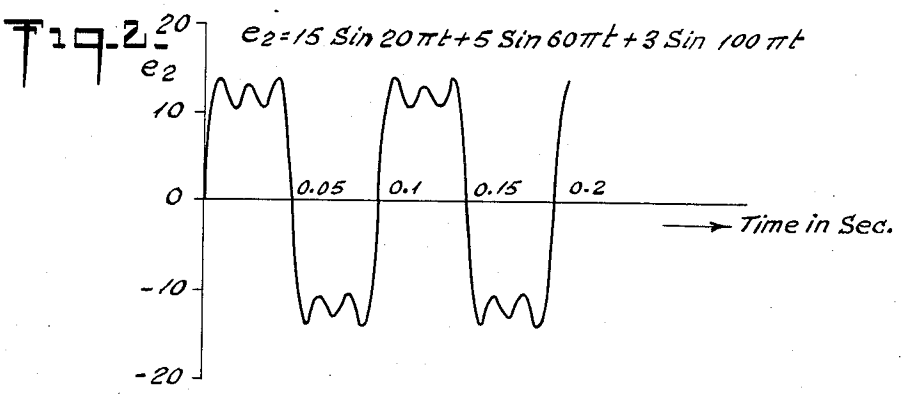
FIGS. 2 through 6 depict five voltage waves each consisting of three sinusoidal voltages of different frequencies.

In order to eliminate any phase distortion in accordance with the instant invention, there are two requirements that must be met. One is that the phase angle difference vs. frequency characteristic must be linear within the band width of the system. The next requirement which is usually ignored is that the intersection of the linear phase characteristic at the ordinate should be zero degree or an integral multiple of 180 degrees, i.e., 0°, ±180°, ±360°, etc. FIGS. 2 through 6 illustrate these requirements clearly. FIG. 2 depicts a voltage wave shape consisting of three different frequency sinusoidal voltages:

$$e_2 = 15 \sin 20\pi t + 5 \sin 60\pi t + 3 \sin 100\pi t \quad (1)$$

Figure 3:
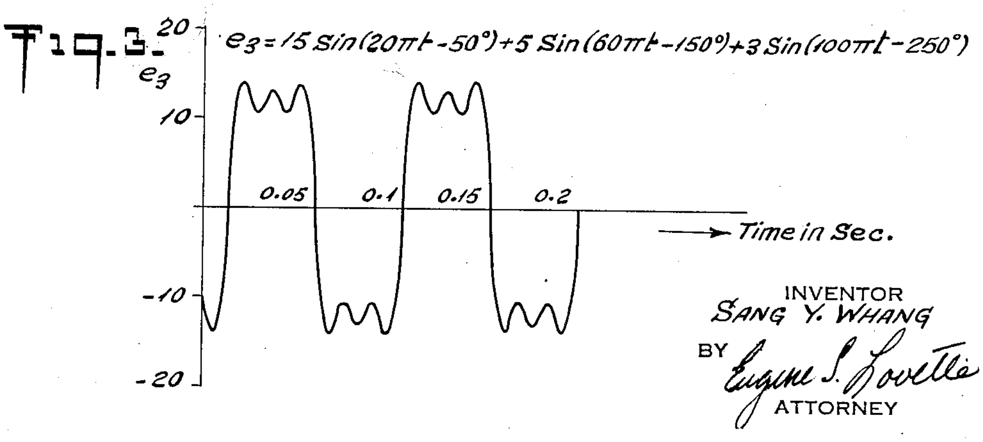

FIG. 3 depicts the following voltage:

$$e_3 = 15 \sin (20\pi t - 50°) + 5 \sin (60\pi t - 150°) + 3 \sin (100\pi t - 250°) \quad (2)$$

Figure 7:
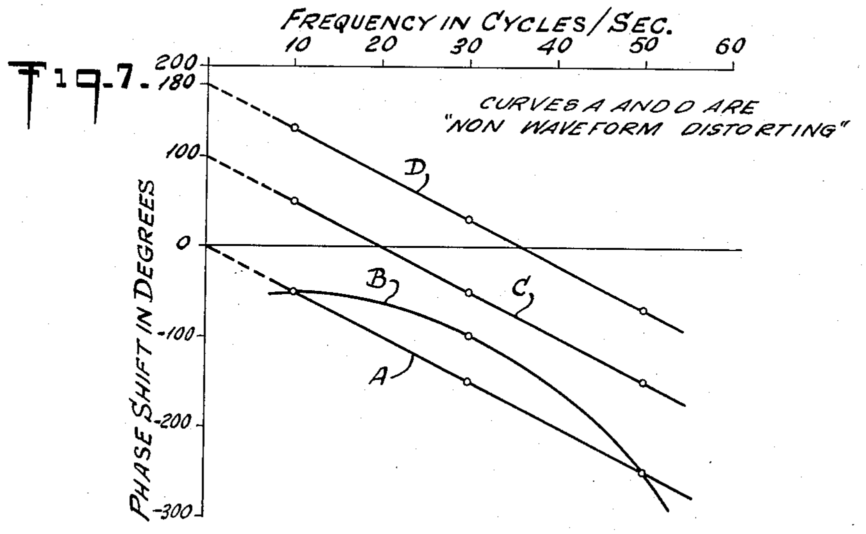
FIG. 7 depicts phase frequency characteristics of four waves sketched in FIGS. 3, 4, 5 and 6 compared with the voltage wave of FIG. 2.

The amplitudes and frequencies of three sinusoidal voltages are the same as before, but the phase angles are different. The first $e_3$ sinusoidal voltage, which is the 10 cycles per second component, lags the one in $e_2$ by 50 degrees. The second $e_3$ sinusoidal voltage, which is the 30 cycles per second component, lags the one in $e_2$ by 150 degrees. And the last $e_3$ sinusoidal voltage, which is the 50 cycles per second component, lags the one in $e_2$ by 250 degrees. The degree of phase angle lag is proportional to the frequencies of the components with proportionality constant of 5 degrees per cycle. The phase differences between the $e_3$ voltages and the $e_2$ voltages are plotted in FIG. 7 as curve A. The curve A in FIG. 7 illustrates a linear phase characteristic with a zero degree intersection at the zero cycle frequency.

The voltage $e_3$ as depicted in FIG. 3 is the same as $e_2$, except that it lags $e_2$ by 13.9 milliseconds. This indicates that when the phase characteristic is linear and its extension intersects with the ordinate at zero degree, the wave shape is delayed but not distorted.

Figure 4:
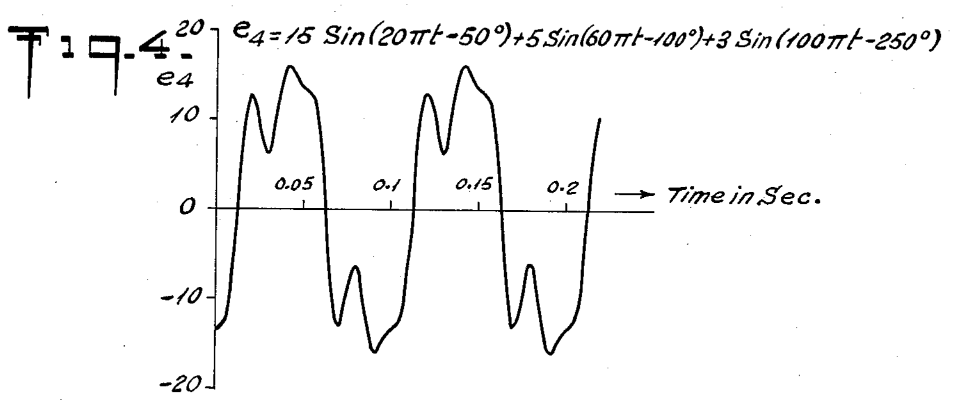

FIG. 4 depicts the following voltage:

$$e_4=15\sin(20\pi t-50°)+5\sin(60\pi t-100°)+3\sin(100\pi t-250°) \quad (3)$$

The voltage $e_4$ is almost the same as $e_3$, except that the second component, i.e., the 30 cycles per second component, is lagging that of $e_2$ by only 100 degrees instead of 150 degrees. This makes the phase characteristics non-linear as shown by the curve B in FIG. 7.

The voltage curve $e_4$ is definitely distorted as compared to curve $e_2$. Since the amplitudes of each component is the same in the two voltages $e_2$ and $e_4$, the only cause for the distortion is the non-linearity of the phase characteristics.

Figure 5:
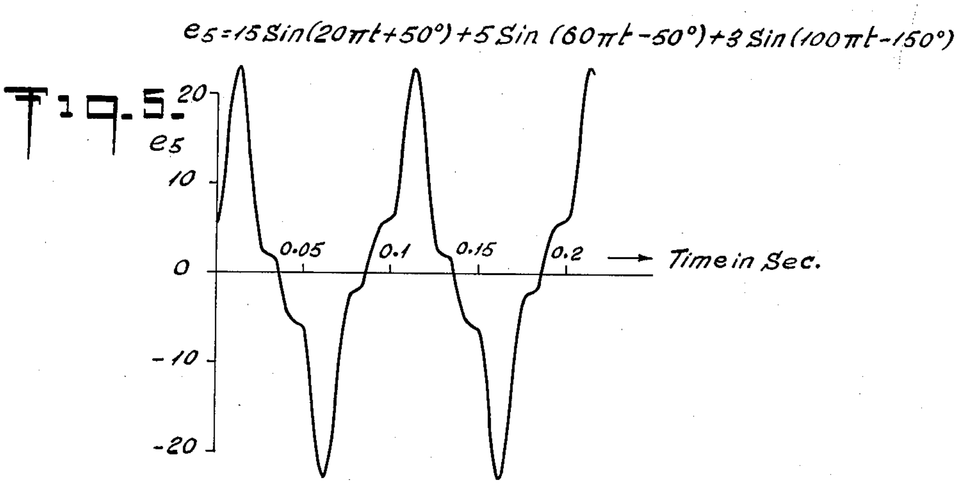

FIG. 5 depicts the following voltage:

$$e_5=15\sin(20\pi t+50°)+5\sin(60\pi t-50°)+3\sin(100\pi t-150°) \quad (4)$$

The phase angle difference for each frequency between $e_2$ and $e_5$ is depicted by curve C on FIG. 7. The phase characteristic is linear; however, the voltage wave of $e_5$ is very much distorted as compared to the voltage wave of $e_2$. Again, since the amplitude of each component is the same as before, the cause of distortion is attributed to its phase characteristic. A conclusion may be drawn from the results of FIGS. 3, 4 and 5 that the linearity of the phase characteristic may be a necessary condition, but not a sufficient condition.

Figure 6:
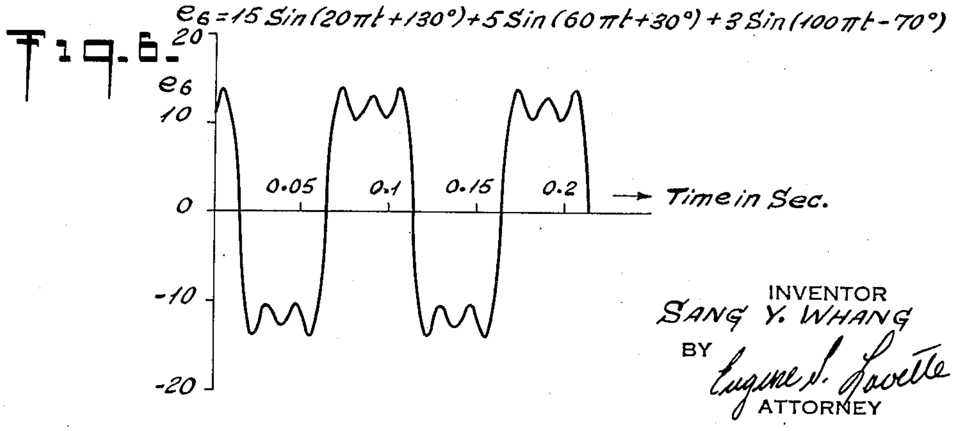

FIG. 6 depicts the following voltage:

$$e_6=15\sin(20\pi t+130°)+5\sin(60\pi t+30°)+3\sin(100\pi t-70°) \quad (5)$$

The phase characteristic of $e_6$ is depicted by the curve D on FIG. 7. The phase characteristic is linear as the case of curves A and C. The only difference between the curves D and C is that the extension of curve C intersects with the ordinate at 100° while the extension of curve D intersects with the ordinate at 180° point. The voltage shape $e_6$ is not distorted as compared to $e_2$. It is the negative of $e_3$ curve, which $e_3$ is the same curve as $e_2$ except it is delayed by 13.9 milliseconds.

The comparison betwen FIGS. 5 and 6 clearly indicates that the intersection between the linear extension of the phase characteristic curve and the ordinate may not be just any point, but some specific point in order to avoid any phase distortion.

These specific points have to be either zero or any other integral multiple of 180 degrees, i.e., 0, ±180, ±360, ±540, etc.

Figure 8:
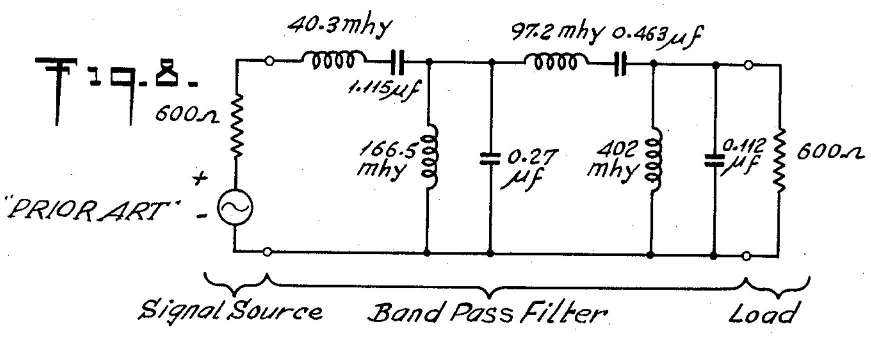
FIG. 8 depicts a typical band-pass filter placed between a source with 600 ohms internal impedance and a 600 ohms resistor load.
Figure 9:
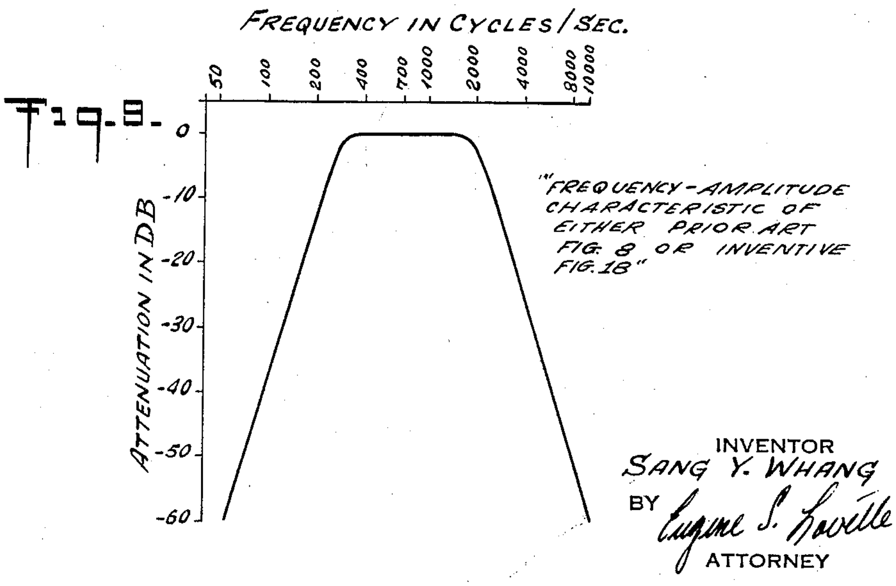
FIG. 9 depicts the attenuation characteristic of the band-pass filter depicted in FIG. 8.
Figure 10A:
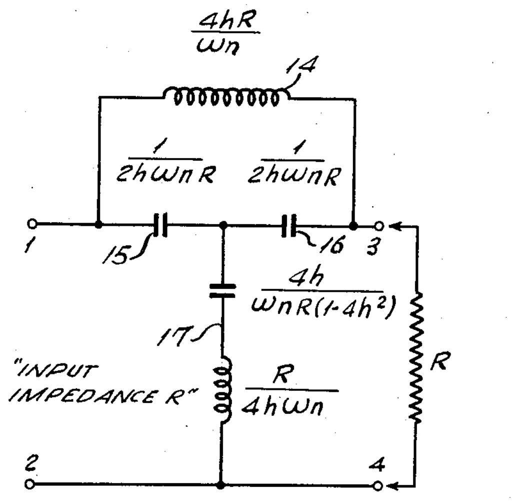
FIG. 10 depicts four different versions of the phase correcting all-pass network.
Figure 10B:
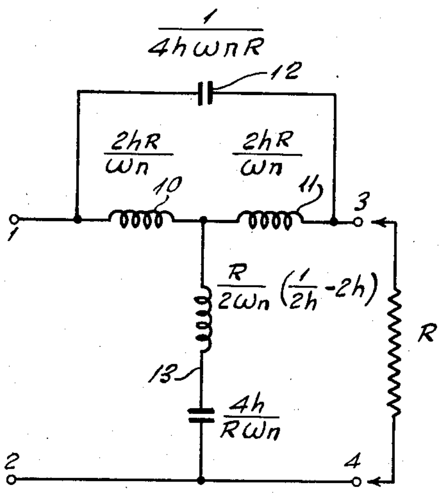
Figure 10C:
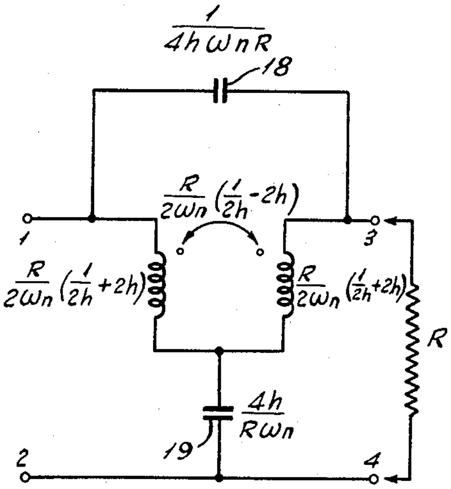
Figure 10D:
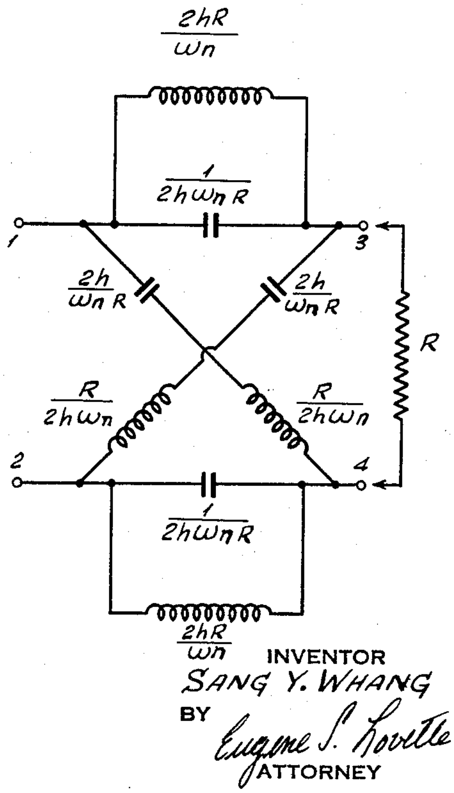

The filter depicted in FIG. 8 is a band-pass filter with an attenuation characteristic as shown in FIG. 9. This filter is designed solely to satisfy the attenuation characteristic. The pass band of this filter is from 270 cycles to 2000 cycles per second. When the lower and upper 3 db cut-off frequencies (270 and 2000) are determined, and the slope of attenuation characteristic at the rejection band is determined, and the source and load resistance are determined, an engineer skilled in the art can design this type of filter by looking up a table as referenced before. The problem with this filter is its poor phase characteristic.

Figure 1:
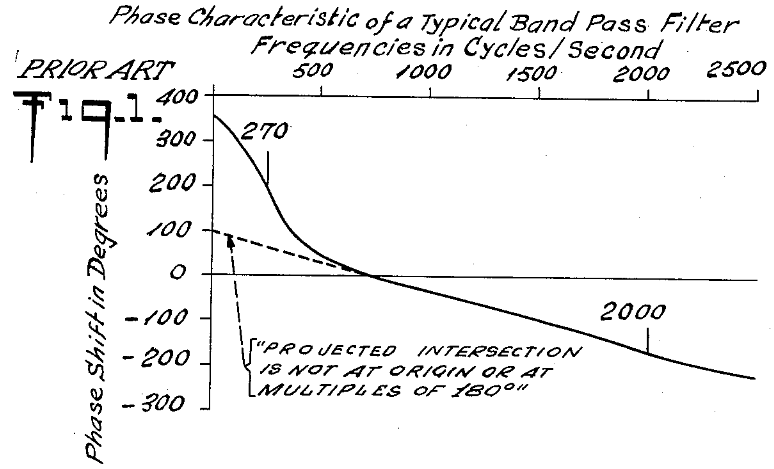
FIG. 1 is a curve which illustrates the phase characteristic of a typical band-pass filter shown in FIG. 8.

The phase characteristic of this particular filter is depicted in FIG. 1. As described hereinbefore, this phase characteristic causes serious phase delay distortion. It is generally understood that one can improve the phase characteristic by employing an all-pass network, as depicted in FIGS. 10*a* to 10*d*. However, exactly how to design an all-pass network to correct a specific phase characteristic or the criteria for correcting phase characteristic is not understood heretofore by the prior art.

All four networks shown in FIG. 10 have constant attenuation characteristics for all frequencies. As a matter of fact, the amplitude of the output voltage is identical to the amplitude of input voltage for any frequency sinusoidal voltage. Impedance looking in from the left hand terminal pair 1 and 2 is a constant R ohm resistance at any frequency for all four networks, provided that they are terminated by R ohms at the right hand terminal pair 3 and 4. This means that any network preceding the all-pass network cannot tell the difference between the all-pass network and a pure resistor of R ohms. Further, this means that the termination of the all-pass network does not have to be an R ohm resistor, but another all-pass network which in turn is terminated by an R ohm resistor. Of course, in theory one can put several all-pass sections in cascade without affecting the network preceding these all-pass sections, provided that the last all-pass section is terminated by a resistor with R ohm resistance.

All the numerical values of the elements in FIG. 10 are expressed in terms of the resonant angular frequency $Wn=2\pi fn$, terminating resistance R, and the design parameter $h$.

This method of expressing element values is used because, as will be explained hereinafter, the design of the all-pass sections are accomplished by selecting proper values of W$n$ and $h$. The value of the R is fixed by the original network for which the phase correction is intended. For the band-pass filter of FIG. 8, the load resistance 600 ohms is the value for R. In other words, once the proper value of W$n$'s and $h$'s are selected for the best phase characteristic, the calculation of the element values are made almost automatically by using the formula in FIG. 10 to obtain the necessary phase correction characteristic.

All four networks, in FIG. 10 have identical transfer characteristic as long as the values of W$n$ and $h$ are the same. Networks *a, b* and *c* of FIG. 10 are used for unbalanced and one terminal grounded system; network *d* of FIG. 10 is used for the balanced network.

Figure 11:
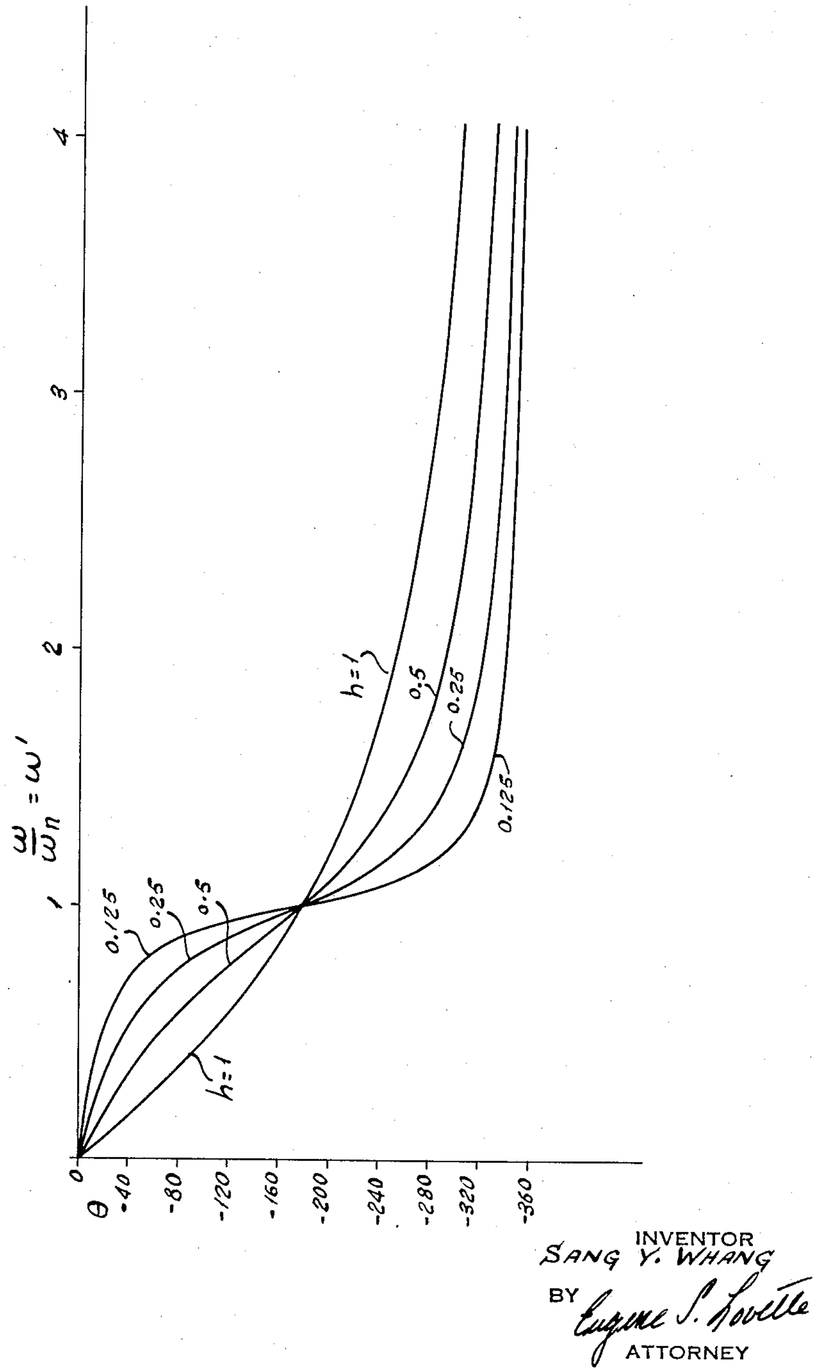
FIG. 11 depicts phase vs. normalized frequency characteristics for several different values of $h$ (a design parameter)

The phase characteristic $\theta$, output phase angle minus input phase angle, of these all-pass networks are shown in FIG. 11. The abscissa represents the normalized frequency $W^1$ which is $W/Wn$ and it is arranged in a linear scale. For the different values of $h$, there is one phase characteristic curve, $\theta$ vs. $W^1$. The phase characteristic $\theta$ is computed by the following formula:

$$\theta(W^1)=-2\left(\tan^{-1}\frac{W^1+\sqrt{1-h^2}}{h}+\tan^{-1}\frac{W^1-\sqrt{1-h^2}}{h}\right) \quad (6)$$

It will be noted from FIG. 11, (1) that the phase angles are 180° when $W^1$ is equal to one, that is, when $W=Wn$, regardless of the values of $h$, and (2) that $$\theta(W^1)=-360°-\theta\left(\frac{1}{W^1}\right)$$

For example, phase angle for $W^1=3$ can be obtained by looking up the phase angle for $W^1=1/3$ and subtract the angle from −360 degrees. This last property makes it possible to prepare a chart with the range of $W^1$ from zero to one and the range of $\theta$ from 0 to 180 degrees. Elimination of $W^1$ range frod 1 to infinity provides a chart with an enlarged scale to make it more accurate.

Figure 12:
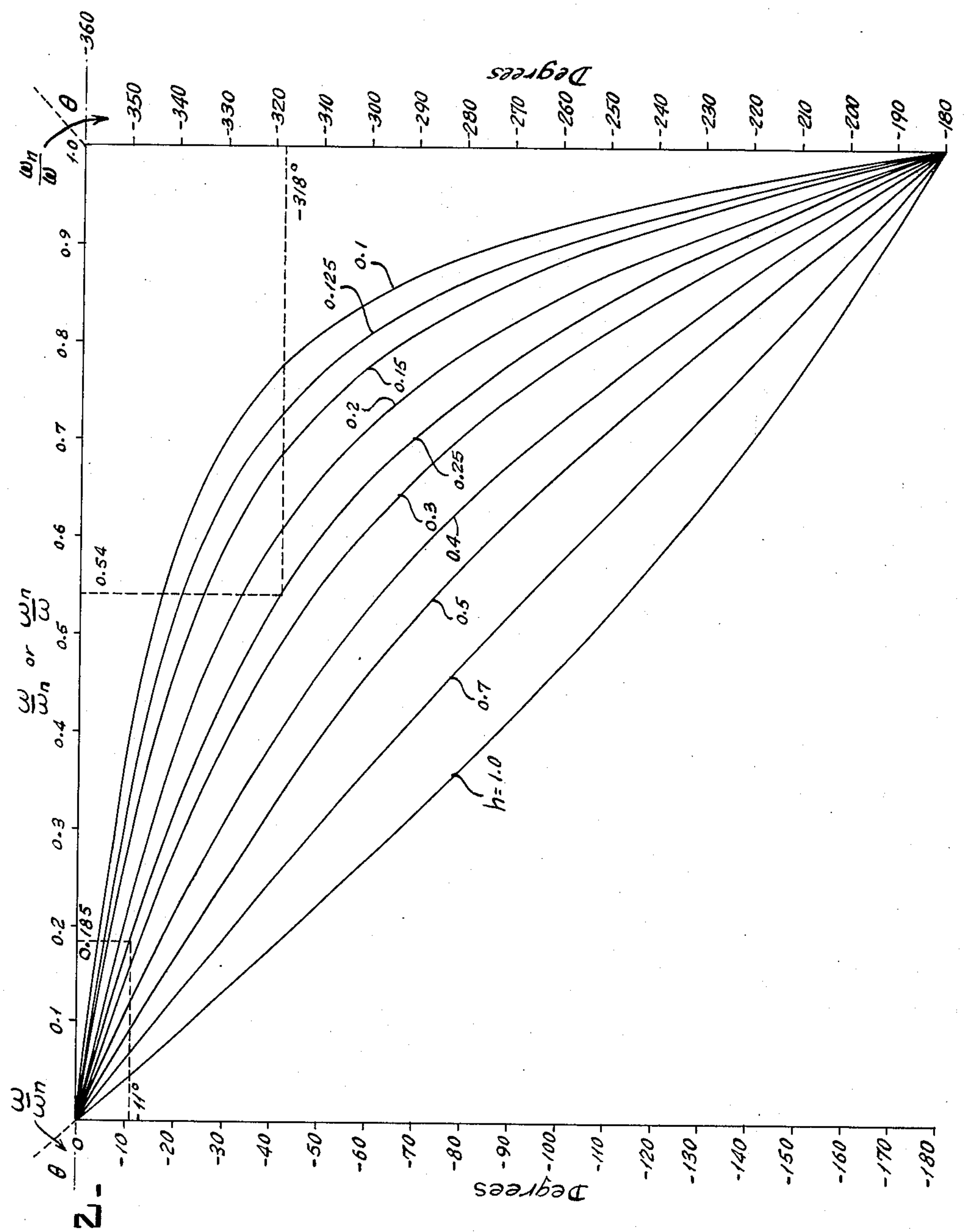
FIG. 12 depicts a more accurate version of FIG. 11 which actually may be used to design the phase correcting network.

FIG. 12 depicts the enlarged phase characteristic curve chart to be used for accurate design work.

A still further very important thing to note from FIG. 11 is the fact that the slope of the curves at any point is never positive, i.e., the magnitude of the phase lag always increases as the frequency increases. This means that by using an all-pass network, one can change the original phase characteristic to more negative, but never in the positive direction, and the magnitude of change always increases as the frequency increases. All the curves start off from zero degree and go through −180° point at $W^1=1$ and eventually reaches −360° as $W^1$ becomes very large. With these characteristics and the shapes of the $\theta$ curves for the different values of $h$ in mind, reference is now made to the design of all-pass, phase-correction network.

Figure 13:
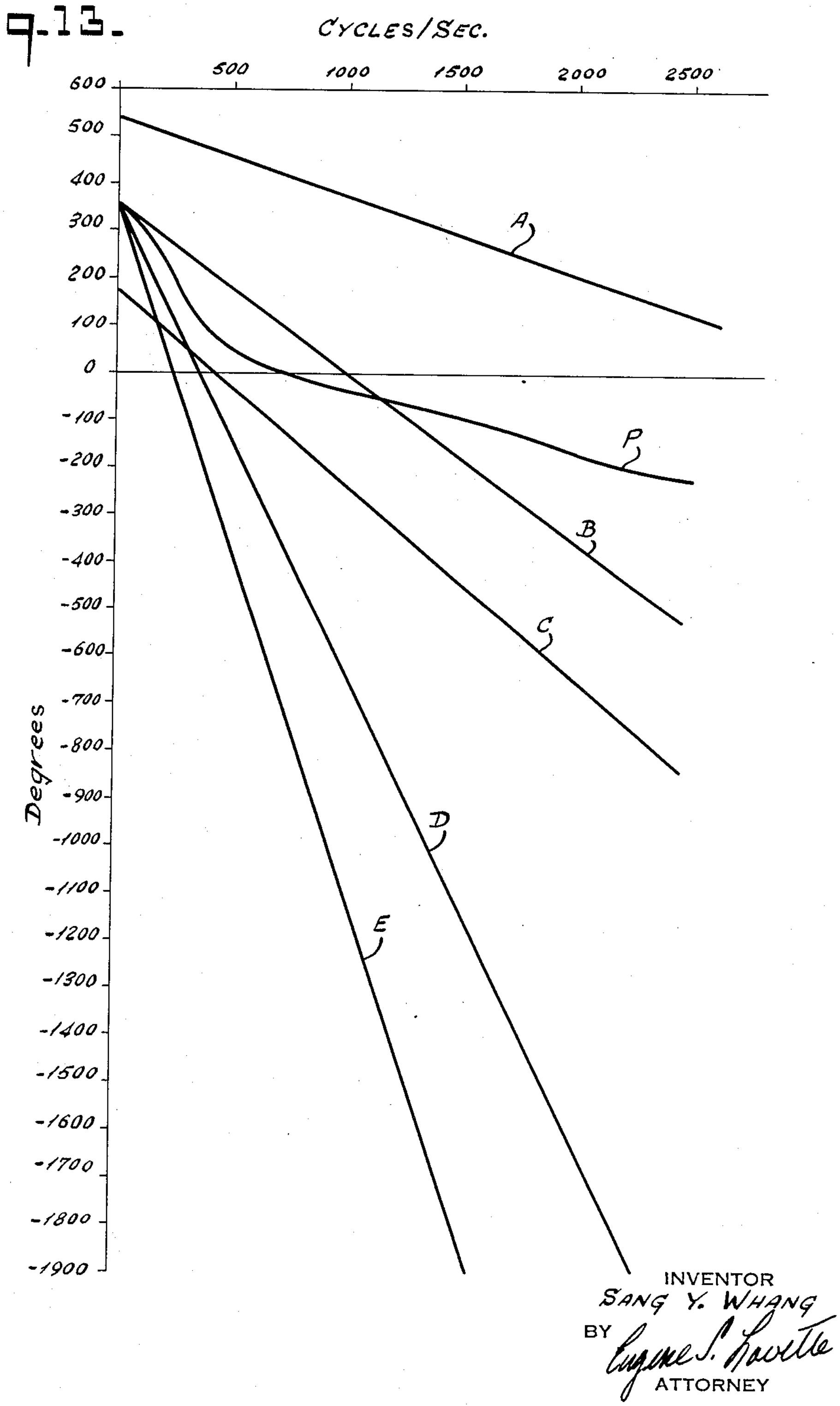
FIG. 13 depicts five linear phase characteristic curves to which the non-linear phase curve P may or may not be straightened into.

Curve P of FIG. 13 is the original phase characteristic to be corrected. All the five straight lines, A, B, C, D and E are linear and the ordinate intersections are some integral multiple of 180 degrees. In other words, if the phase characteristic curve P was changed into any one of these straight lines, there would be no phase distortion at all. Of course these five lines are not the only lines that will avoid phase distortion. Any line which satisfies the two necessary and sufficient conditions mentioned before will do. These five lines are selected just to illustrate possibilities and impossibilities of the all-pass section design.

Curve A is impossible for curve P to reach because all the points on curve A at any frequency are more positive than the points on curve P at the same frequnecy. The all-pass network can compensate the phase curve to make same more negative, but not more positive; therefore, the curve A is eliminated.

Curve B crosses curve P at a frequency within the pass-band. At the higher frequencies above the crossing point, it is possible to bring curve P down close to curve B. However, for the lower frequencies below the crossing point, curve P will deviate more from the preferred curve B even though it is being properly compensated in the higher frequency region. If the important frequency spectrum lies in the higher frequency region, this arrangement can be used satisfactorily.

All points on curve C are more negative as compared to the points on curve P; however, the separation between curves P and C at 200 cycles is much greater than the separation at 500 cycles. The all-pass network cannot bring down the P curve more at the lower frequency and less at the higher frequency. As previously noted, the compensating network provides a greater negative phase shift for the higher frequencies. If the P curve is brought down sufficiently low at around 200 cycles to approach curve C, it will be too low for the frequencies above 300 cycles. The curve P can be brought down very close to curve C from 450 cycles and up by using only two all-pass sections. From 450 cycles and below, the curve will not be too close to curve C. Here again, if the system can tolerate low frequency distortion, this will be a good selection.

Curve D represents perhaps the best choice of the group. All the points on curve D are more negative as compared to the points on curve P for each frequency, and the separation between curves D and P increases (not decreases) as the frequency increases. Curve E also meets this requirement; however, curve E is steeper than the curve D and results in more separation from the P curve as the frequency reaches 2500 cycles per second. More separation at the high frequency requires an increased number of all-passed sections to approach the desired curve pattern. One can estimate the approximate number of sections by dividing the separation between curve P and desired curve at the highest frequency of interest (2500 cycles) by 300 degrees; the 300 degrees represents the average magnitude of the phase angle, each section lowers the P curve at the high frequency end.

Figure 14:
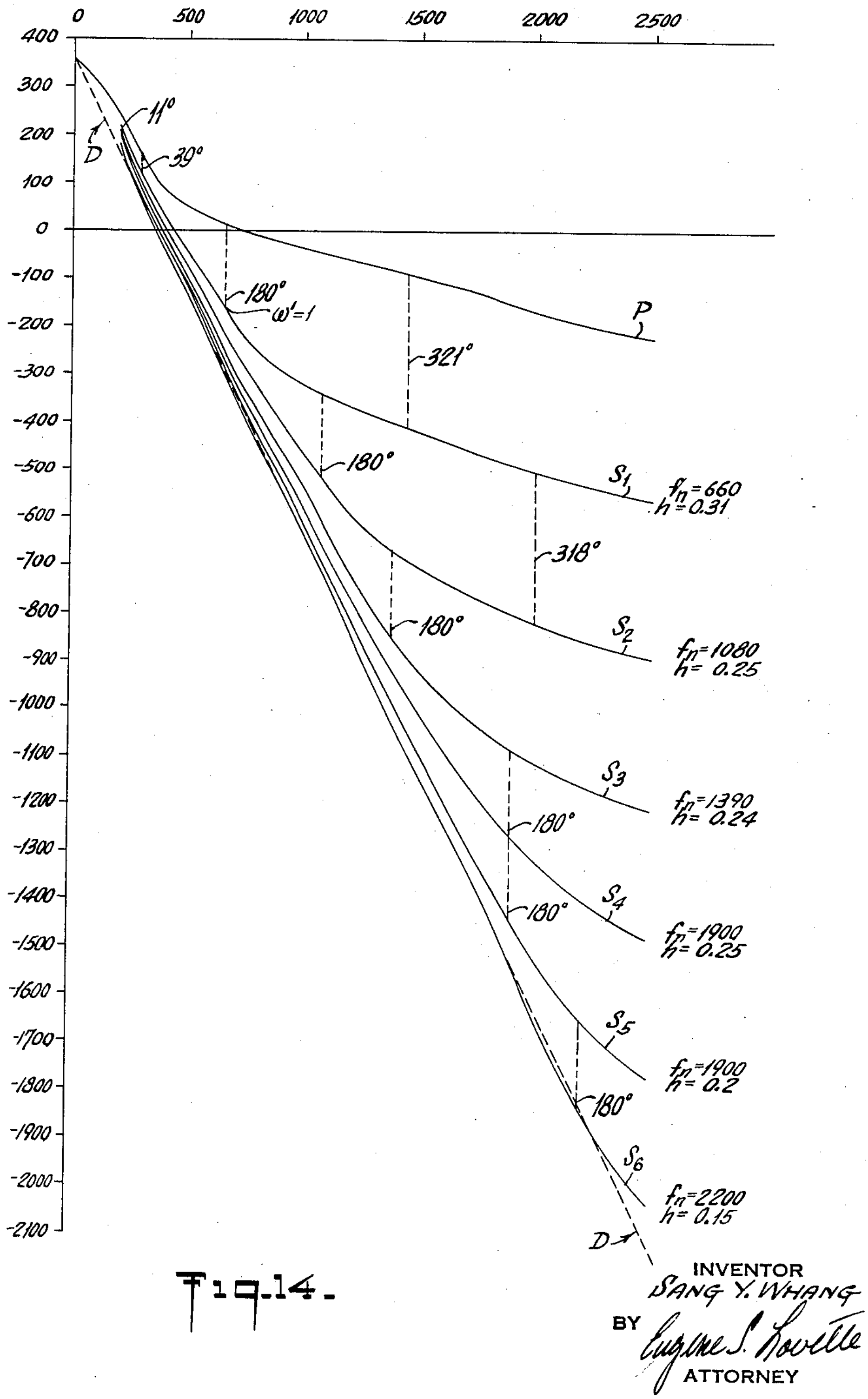
FIG. 14 illustrates actual straightening of a non-linear phase characteristic using six correcting sections.

FIG. 14 illustrates the method of selecting $Wn$'s and $h$'s for six all-pass sections for the purpose of shifting the original phase curve P to linear phase curve D which intersects the ordinate at 360 degrees.

The resonant frequency $fn$ of the first section is selected at 660 cycles, i.e., $Wn_1=2\pi\times660$. This means that the curve P will come down 180 degrees at the 660 cycles point regardless of value of $h$ for this section. The value of $h$ for this first section is made 0.31. Once the values of $Wn$ and $h$ are picked, the additional angle difference due to this first section is obtained by using Equation 6 or FIG. 12. A few sample calculations using Equation 6 are shown below:

$$\text{At 300 cycles: } W_1=\frac{W}{Wn}=\frac{300\times2\pi}{660\times2\pi}=0.4545$$

$$\theta(0.4545)=-2\left(\tan^{-1}\frac{0.4545+\sqrt{1-(0.31)^2}}{0.31}+\tan^{-1}\frac{0.4545-\sqrt{1-(0.31)^2}}{0.31}\right)$$
$$=-2\,(\tan^{-1}4.533+\tan^{-1}-1.601)$$
$$=-2(77.57^\circ-58.01^\circ)=\underline{-39.12\text{ degrees}} \quad (7)$$

The value of $\theta(W^1)=-39.12°$ is checked by FIG. 12 for $h=.31$ and $W^1=.4545$.

$$\text{At 1452 cycles: } W^1=\frac{1452\times2\pi}{660\times2\pi}=2.2$$

$$\theta(2.2)=-2\left(\tan^{-1}\frac{2.2+\sqrt{1-(0.31)^2}}{0.31}+\tan^{-1}\frac{2.2-\sqrt{1-(0.31)^2}}{0.31}\right)$$
$$=-2\,(\tan^{-1}10.164+\tan^{-1}4.0299)$$
$$=-2(84.38^\circ+76.06^\circ)=\underline{\underline{-320.88\text{ degrees}}} \quad (8)$$

Just to demonstrate the point mentioned above, $$\theta(2.2)=-360-\theta\left(\frac{1}{2.2}\right)=-360-\theta(0.4545) \quad (9)$$

$\theta(0.4545)=-39.12$ degrees according to Equation 7 and FIG. 12. Therefore, $$\theta(2.2)=-360-(-39.12)=\underline{\underline{-320.88}}$$

which is the same as Equation 8. In other words, $\theta(2.2)$ can be obtained easily if we have $$\theta\left(\frac{1}{2.2}\right)$$

This means that if $\theta(W^1)$ for a particular $h$ is calculated or illustrated fairly accurately for $W^1$ from zero to one, the angle at any frequency may be determined by using the calculated numerical table, or FIG. 12, directly for $W^1$ zero to one. For $W^1$ greater than one, find $1/W'$ and use the table or chart for this angle and use the following formula:

$$\theta(W^1)=-360-\theta\left(\frac{1}{W^1}\right) \quad (10)$$

After calculating angles for sufficient number of frequencies, they are added to the original curve P of FIG. 14 whereby the new or resulting curve $S_1$ is obtained. From FIG. 11, it is obvious that if $h$ were smaller than 0.31, the curve $S_1$ will reshape in such a manner that all the points to the left of 660 cycle point will be pushed up and all the points to the right of 660 cycle point will be pulled down. If the value of $h$ were bigger than 0.31, exact opposite will take place. Note the angle 180 degrees at 660 cycles does not change.

If the resonant frequency, $fn$, is selected lower than 660 cycles, for the same value of $h$, all points of the new curve will be lower than curve $S_1$ and if the selected resonant frequency, $fn$, is a higher value than 660 cycles, all the points on curve $S_1$ will be pushed up. This change of curve P by changing the resonant frequency, in general, is greater at around resonant frequency and less as you go further away from the resonant frequency.

The change of curve P by changing the value of $h$ is rather obvious from FIG. 11; no change at zero frequency and some maximum change somewhere in between zero and resonant frequency; and again no change at resonant frequency and maximum in the opposite direction to the first maximum point at some frequency above the resonant frequency and no change at infinite frequency. The exact change of angle due to the change of $h$ can be obtained very easily from FIGS. 11 and 12.

The next section is made to have resonant frequency of 1080 cycles ($Wn=1080\times2\pi$) and $h$ of 0.25. Since FIG. 12 provides a curve for $h=0.25$, the use of FIG. 12 will be demonstrated for few points of this second section.

$$\text{At 200 cycles: } W^1=\frac{200\times2\pi}{1080\times2\pi}=0.185$$

Locate 0.185 on the abscissa of FIG. 12 and follow down the 0.185 line until it meets $h=0.25$ curve. From this junction follow horizontally to the left to read −11 degrees on the ordinate. −11 degrees is the amount of $\theta$ compensation added by the second section at 200 cycle point.

$$\text{At 2000 cycles: } W^1=\frac{2000\times2\pi}{1080\times2\pi}=1.85$$

Since $W^1$ is greater than one, find $1/W^1$ which is 0.54. Locate 0.54 on the abscissa of FIG. 12 and follow down the 0.54 line until it meets $h=0.25$ curve. From the junction, follow horizontally to the right to read −318 degrees on the right hand ordinate. −318 degrees is the answer. For $W^1$ less than 1, the left hand ordinate should be used, and for $W^1$ greater than 1, $1/W^1$ is used and the right hand ordinate should be used.

The phase characteristic of the composite filter, including the two phase correction sections, is given as curve $S_2$ in FIG. 14. In similar manner, the remaining four sections are designed. Each resonant frequency and $h$ is spelled out in FIG. 14. The essential thing to have in mind in selecting resonant frequencies and $h$'s is to bring down the P curve to straight line D as close as possible with the least number of sections.

The design method described above gives a fairly good phase characteristic; however, if one wishes to improve further the phase characteristic, some adjustment of resonant frequencies and $h$'s can be made for such purpose. Following, is the method of adjusting resonant frequencies and $h$'s to improve further the phase characteristics. After all the sections are selected, calculate total phase angle difference due to the original filter and six phase correcting sections and find out the error between the phase characteristic and the straight line D of FIG. 14.

Figure 15:
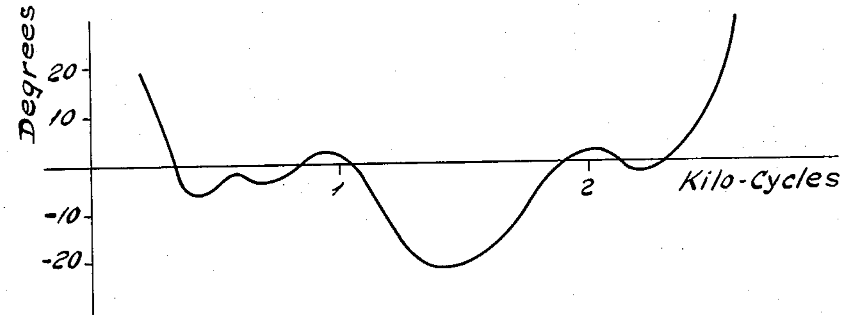
FIGS. 15, 16 and 17 depict some sample error curves to illustrate the technique of adjusting the design to further straighten the phase characteristic.

Suppose the error curve obtained came out to be the curve of FIG. 15. The middle section around 1400 cycles is too low. In order to bring up this middle section, the resonant frequency of the third section is changed from 1390 to some higher frequency. The desired change at 1390 cycles is approximately 20 degrees. Referring to FIG. 12, curve $h=0.25$, changing $W^1$ from 1 to 0.96 gives change of approximately 20 degrees. Judging from this, the third section's resonant frequency is made at 1390/0.96=1448 cycles. If any part of error curve is too high up and that portion is near a resonant frequency of one of the phase correcting sections, lower the resonant frequency of that section enough to bring down the error curve near that resonant frequency.

The rule is that the increase of resonant frequency pushes the error curve up at around that frequency and the decrease of resonant frequency pulls the error curve down at around that frequency. The amount of change can be determined from FIG. 12.

Figure 16:
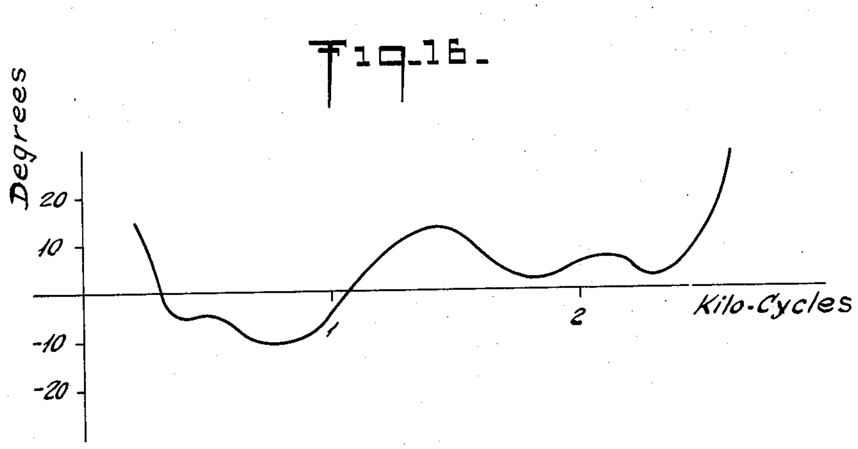

Suppose the error curve obtained came out to be the curve of FIG. 16. There is a general tendency that the left-hand portion of the curve is low and the right-hand portion of the curve is high. This could be corrected by changing the $h$ of a section whose resonant frequency is somewhere in the middle of transition from low to high.

In this case, the second section with $fn=1080$ cycles is the one that is applicable. Referring to FIG. 12, the change of $h$ from 0.25 to 0.2 results a change of 13 degrees upward at $W^1=0.8$ or at $1080\times0.8=864$ cycle point and a change of 13 degrees downward at $$W^1=\frac{1}{0.8}$$

or at 1080/0.8=1350 cycles. Since the required change should be in the neighborhood of 10 degrees, $h$ of 0.21 will be a better choice.

The rule here is that decrease of $h$ results in pushing up the lower frequency range and pulling down the higher frequency range. The converse is also true. In this instance, the higher or lower frequency is with respect to the resonant frequency of the section whose $h$ is being changed.

A few changes of $Wn$'s and $h$'s can refine phase characteristics very well. The values of $Wn$'s and $h$'s given in the sample design are the end results of several adjustments. The criterion is to smooth out the error curve to make same as straight as possible.

Figure 17:
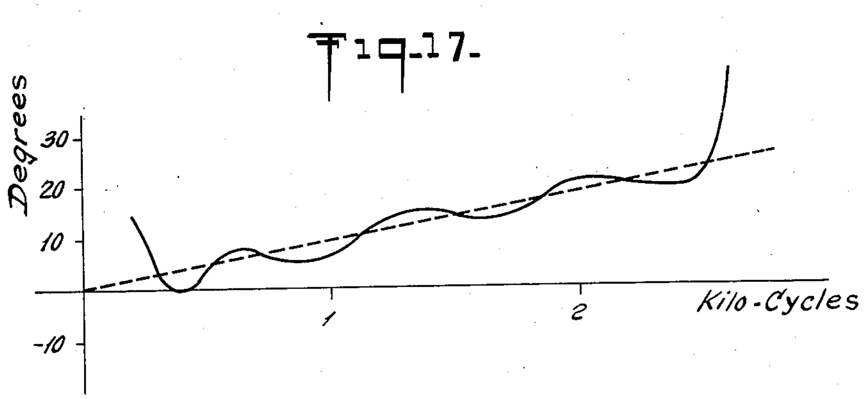

In minimizing the ripples of the error curve with respect to the horizontal axis as a reference, it may be more convenient to use some other line as the reference. This is acceptable provided that this new reference line intercepts the origin. For example, the dotted line of FIG. 17 is an acceptable reference around which to minimize the ripples of the error curve. This different reference straight line means a slightly different original D line of FIG. 14. As long as the dotted line of FIG. 17 starts from the origin, it is equivalent of having a different reference line D in FIG. 14 which starts at 360 degree point and has a slightly different slope than the original line D. As mentioned before, this does not cause any phase distortion.

Deviation of the error curve from a straight line starting from the origin indicates the phase delay error. Time delay error is calculated by dividing the error in degrees by 360 degrees and frequency at which this error exists.

For example, 5 degree error at 300 cycles means $$\frac{5}{300\times360}=46.3\times10^{-6}$$

second or 46.3 micro-seconds error. A 5 degree error at 2000 cycles means $$\frac{5}{2000\times360}=6.9\times10^{-6}$$

second or 6.9 micro-seconds error.

For a given limit of delay error tolerance, one can allow more phase error at the higher frequency range than at the lower frequencies. The distortion of the wave shape is directly related to the delay error not the phase error; therefore, in adjusting $Wn$'s and $h$'s one should try to straighten the lower frequency end more than the higher frequency end, sometimes even at the sacrifice of the higher frequency phase characteristic.

Figure 18:
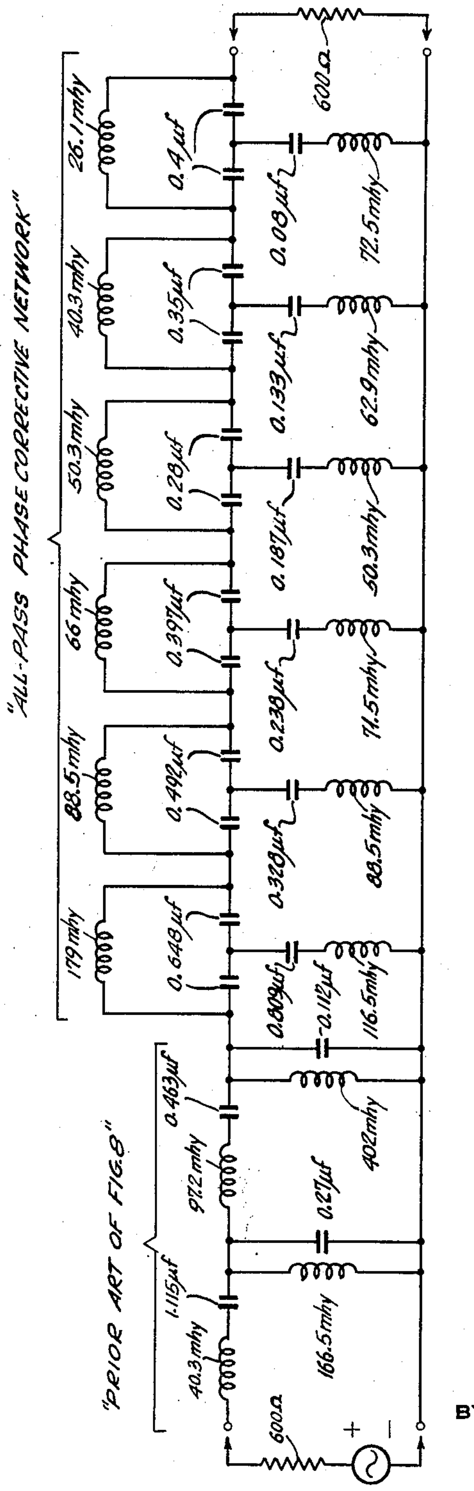
FIG. 18 depicts the complete filter and phase correction network designed in accordance with a FIG. 14 design.

FIG. 18 depicts the example filter and phase correction sections all combined. Values of inductance are in millihenries and capacitance in microfarads. It has been found that with a little experience of designing $Wn$'s and $h$'s one can choose the proper values of $Wn$'s and $h$'s for each phase curve at least by the second trial, if not at the first. When there is a complex system with amplifiers, filters, transmission lines, equalizers, etc., it is in general better to obtain the overall phase characteristic of the system all tied together and correct that phase characteristic curve rather than trying to correct the filter alone, or amplifier alone and tie all together. This way, it will require the least number of sections for the best phase characteristic. However, when the overall system has some variables, such as, different lines and/or different length of line for each application, etc., one must try to come up best phase characteristic for each component rather than for the entire system.

The following is the method of realization of the design into actual circuit. As mentioned before, once the values of Wn's and h's are determined, the evalutation of the circuit component is just a matter of plugging in numbers to the formula given in FIG. 10. Each component in FIG. 10 is expressed in terms of Wn and h and R, wherein the values of inductance are in henries and the values of capacitance are in farads. However, in all practical circuits, the capacitors and inductors used are not exactly the same value as the calculated value. In other words, there are physical tolerances in all component values; ±10%, ±5%, or ±2% tolerances are comcon in the industry. The units that hold to the tighter tolerances cost more. Lets assume that we have ±5% tolerance components. In FIG. 10, if Wn is 5% too high or low, all the components are 5% too low or high, respectively. Therefore, if the components have ±5% tolerances, it could result in ±5% variation in the resonant frequency; whereby a ±5% variation of the resonant frequency may mean as much as ±45 degrees error of the phase characteristic depending upon the value of $h$. In FIG. 12, $W/Wn$ of 0.95, which represents the 5% difference from $W/Wn$ of 1, has a phase angle difference from 180 degrees, of as much as 45 degrees for $h=0.125$ curve. For $h=0.5$ curve, the angle error is 11 degrees. For the lower values of $h$, more error is introduced in the phase characteristic due to the error in the resonant frequency. However, ±5% error on the value of $h$ does not cause such a drastic error on the phase characteristic. Careful study of FIG. 12 reveals that ±5% variation of the value of $h$ causes the maximum change of ±3 degrees on the phase characteristic.

This means that if one can maintain the designed value of Wn using ±5% tolerance components, one can get the phase characteristic fairly close to the designed value. Even with ±2% tolerance components, if the resonant frequency is allowed to vary ±2%, one can get as much as ±10 degrees error.

Maintaining the correct designed value of Wn means that the phase correcting section shifts the phase angle by 180 degrees at the resonant frequency. This means that the output is negative of the input at the resonant frequency. The circuit ($d$) of FIG. 10 has a rather obvious configuration to achieve 180 degree shift at resonant frequency. At the resonant frequency, the top and bottom branches consisting of an inductor and a capacitor in parallel reach maximum impedance while the crisscross branches consisting of an inductor and a capacitor in series reaches minimum impedance; that is, the top and bottom branches reach parallel resonance while the crisscross branches reach series resonance.

When this happens, the terminal 4 of the circuit ($d$) is shorted to the terminal 1 of the circuit ($d$) and the terminal 3 of the same circuit is shorted to the terminal 2 of the same circuit due to the series resonance of the crisscross branches and at the same time, the terminals 1 and 3, and 2 and 4 are isolated or open circuited from each other due to the parallel resonance of the top and bottom branches. In effect, the output voltage is reversed from the input voltage. Physically, this is achieved by tuning the capacitor or inductor of each branch against the inductor or the capacitor, respectively of the same branch to achieve the resonant state at the designed frequency. In general, it is easier to tune an inductor rather than a capacitor.

One can vary inductance very easily by simply adding or removing turns of wire or by moving a magnetic core in or out with respect to the coil winding, so called slug tuning. When using ±5% tolerance capacitors, simply tune the inductor to achieve resonance at the predetermined value of frequency for each branch. In order to maintain the resonant frequency, the inductance should be increased to compensate for a capacitance which is too low, or conversely, the inductance should be lowered to compensate for a capacitance which is higher than its rated value.

For the circuit ($b$) of FIG. 10, two inductors 10, 11 with inductance value of $$\frac{2hR}{Wn}$$

are put in series and are tuned against capacitor 12, whose capacitance is $$\frac{1}{4hWnR}$$

to achieve resonance at the precalculated resonant frequency. The impedance of the two inductors in series at resonant frequency is $j4h$R ohm and the impedance of capacitor 12 at resonant frequency is $-j4hR$ ohm; thus canceling each other out to achieve parallel resonance at the resonant frequency. To tune the branch 13 which joins the top and bottom, the following is done. Connect the two inductors 10, 11 just tuned in parallel and connect the parallel inductors in series with branch 13 that joins the top and bottom. Tune the inductor with inductance value of $$\frac{R}{2Wn}\left(\frac{1}{2h}-2h\right)$$

henry so that the entire combination reaches resonance at the calculated resonant frequency.

At the resonant frequency, two inductors 10, 11 in parallel gives the impedance of $jh$R ohm, and the inductor being tuned has the impedance of $$\left(\frac{R}{j4h}-jhR\right)$$

ohm, and the capacitor at the bottom has the impedance of $$\frac{R}{j4h}$$

ohm. Total summation of impedance is zero at this resonant frequency. Since the calculated circuit combined in prescribed manner must reach zero impedance at resonant frequency, the actual circuit is forced to reach zero impedance in the same manner even with ±5% tolerance component by tuning the inductors. It can be shown by complex network analysis that the output voltage is the negative of the input voltage at the resonant frequency if the network is tuned as prescribed above even with ±5% components.

The circuit ($a$) of FIG. 10 is also tuned in a similar manner. Tune the top inductor 14 against the two top capacitors 15, 16 in series to achieve resonance at the resonant frequency. Then, join terminals 1 and 3 of the circuit ($a$) and tune the bottom inductor to achieve resonance between the terminals 1 and 2. For this latter tuning operation, the top inductor 14 is shorted out and the two top capacitors 15, 16 are connected in parallel and are in turn joined in series with the branch 17 which joins the top and bottom.

The tuning of circuit ($c$) of FIG. 10 is rather difficult. It involves the adjustment of self-inductance and mutual inductance, and if the coupled coils are to be tuned, tuning of one affects the tuning of the other and this becomes quite complicated. If at all possible, it is preferable to tune the capacitors for this circuit. In particular, by using individual top and bottom capacitors 18, 19 with lower values and adjusting to correct value by the addition of small values of capacitors in parallel with same until a parallel resonance at the calculated frequency is achieved between terminals 1 and 3 of circuit ($c$) while terminals 2 and 4 are unconnected, i.e., open. For the bottom capacitor 19, tie terminals 1 and 3 together and similarly adjust the bottom capacitor 19 until the series resonance is achieved between terminals 1 and 2 at the calculated resonant frequency.

As long as the actual circuits are tuned the way prescribed above, the components could have tolerances of ±5% without causing significant deviation from the calculated phase characteristic.

There are some more practical aspects which are noteworthy. If $h$ is greater than 0.5, $(1-4h^2)$ and $$\left(\frac{1}{2h}-2h\right)$$

become negative and a capacitor in circuit ($a$) of FIG. 10 and an inductor in circuit ($b$) of FIG. 10 become negative and impracticable. The mutual inductance of the circuit ($c$) of FIG. 10 also becomes negative; however, negative mutual inductance can be achieved simply by reversing the wire of either primary or secondary coil of the coupled coil. This is the reason why the circuit ($c$) of FIG. 10 is included despite the fact that it is so difficult to tune and that the coupled coils with proper self and mutual inductances are more expensive.

Circuit ($d$) of FIG. 10 does not contain any negative component at any value of $h$; however, it contains a greater number of components and the terminals 2 and 4 have different potential. It is suitable for a balanced system. However, for an unbalanced system, where the grounds of both input and output must be at the same potential, this type of symmetrical lattice structure requires an isolation transformer.

The designer should not try to select the value of $h$ greater than 0.5 if at all possible. If the system calls for a balanced operation, the value of $h$ could be any value.

For $h$ less than 0.5, the circuit ($a$) or ($b$) will be the preferred choice. The circuits ($a$) and ($b$), as a matter of fact, even the circuit ($c$), are perfectly interchangeable one from the other electrically as long as they have same values of $h$ and W$n$ and tuned as mentioned before.

It is intended that all matter contained in the above description or shown in the accompanying drawings shall be interpreted as illustrative and not in a limiting sense.

What is claimed is:

An electrical network for coupling a complex wave source to a load, said network comprising, first means for providing a selected amplitude and arbitrary phase characteristic over a selected signal bandwidth, and second $n$-sections of all-pass network means coupled to said first means for providing a constant amplitude characteristic and selected phase characteristic, said selected phase characteristic being complementary with respect to said arbitrary phase characteristic, said first and second means providing a summation phase characteristic which is substantially linear over said selected bandwidth of frequencies, and which summation phase characteristic is zero or a multiple of ±180° upon extrapolation of said linear portion of said overall phase characteristic to zero cycle per second frequency, whereby the output complex wave form to the load is substantially unchanged with respect to the input wave form from the source.

References Cited in the file of this patent

UNITED STATES PATENTS

| | | |
|---|---|---|
| 1,624,665 | Johnson et al. | Apr. 12, 1927 |
| 1,770,422 | Nyquist | July 15, 1930 |
| 2,054,794 | Dutzold | Sept. 22, 1936 |
| 2,070,677 | Norton | Feb. 16, 1937 |
| 2,124,599 | Wrener et al. | July 26, 1938 |
| 2,128,257 | Lee et al. | Aug. 30, 1938 |
| 2,177,761 | Wheeler | Oct. 31, 1939 |
| 2,342,638 | Bode | Feb. 29, 1944 |
| 2,450,352 | Piety | Sept. 28, 1948 |
| 2,567,380 | Kingsbury | Sept. 11, 1951 |
| 2,696,591 | Leroy | Dec. 7, 1954 |
| 2,831,919 | Lockhart | Apr. 22, 1958 |
| 2,914,738 | Oswald | Nov. 24, 1959 |
| 2,922,128 | Wemberg | Jan. 19, 1960 |